United States Patent [19]

Satyanarayan et al.

[11] Patent Number: 4,714,518
[45] Date of Patent: Dec. 22, 1987

[54] DUAL LAYER ENCAPSULATION COATING FOR III-V SEMICONDUCTOR COMPOUNDS

[75] Inventors: Arumugam Satyanarayan, Bradford; Aland K. Chin, Sharon, both of Mass.

[73] Assignee: Polaroid Corporation, Cambridge, Mass.

[21] Appl. No.: 3,317

[22] Filed: Jan. 14, 1987

[51] Int. Cl.⁴ ............................................. B44C 1/22
[52] U.S. Cl. ................................... 156/635; 156/643; 156/653; 427/37; 427/38; 427/259; 427/264; 427/265; 427/376.6; 437/227; 437/241
[58] Field of Search ................. 156/643, 653, 635; 427/37, 38, 89, 91, 94, 376.6, 259, 264, 265

[56] References Cited

U.S. PATENT DOCUMENTS

| | | | |
|---|---|---|---|
| 3,325,392 | 6/1967 | Rummel | 204/192 |
| 4,181,564 | 1/1980 | Fogarty et al. | 156/643 |
| 4,223,048 | 9/1980 | Engle, Jr. | 427/39 |
| 4,333,965 | 6/1982 | Chow et al. | 427/93 |
| 4,342,617 | 8/1982 | Fu et al. | 156/643 |
| 4,395,438 | 7/1983 | Chiang | 427/94 |
| 4,603,059 | 7/1986 | Kiyosumi et al. | 427/81 |

Primary Examiner—Bernard D. Pianalto
Attorney, Agent, or Firm—Edward S. Roman

[57] ABSTRACT

A method for providing a dual layer diffusion mask or encapsulation coating for use with III-V compound semiconductors, the dual layer coating comprising an inner layer of silicon which closely matches the coefficient of thermal expansion of the III-V compound semiconductor and an outer layer of silicon nitride which is relatively impermeable to subsequent metallization and for thereafter applying metallized contacts to the III-V compound semiconductor through selectively etched openings in the diffusion mask or encapsulation coating.

17 Claims, 6 Drawing Figures

DUAL LAYER ENCAPSULATION COATING FOR III-V SEMICONDUCTOR COMPOUNDS

BACKGROUND OF THE INVENTION

1. Field of the Invention

This invention relates generally to a method of providing a dual layer masking or encapsulation coating for a III-V compound semiconductor substrate and for providing metallized contacts therefor and, more particularly, to a method for providing dual layers of silicon and silicon nitride to operate as a mask or encapsulation coating for a III-V compound semiconductor substrate and for thereafter applying metallized contacts to the III-V compound semiconductor substrate.

2. Description of the Prior Art

It is well known in the art to use silicon dioxide or silicon nitride coatings as a dielectric diffusion mask coating for III-V compound semiconductors. However, the coefficient of thermal expansion for these coatings may differ substantially depending upon the deposition conditions from that of the III-V compound semiconductors thereby resulting in problems associated with interfacial stress or cracking of the coatings during thermal treatment. The silicon dioxide or silicon nitride coatings may be deposited on the III-V semiconductor compounds using a high temperature chemical vapor deposition (CVD) or a low temperature plasma enhanced chemical vapor deposition (PECVD) process. In the high temperature chemical vapor deposition process, the temperatures required to achieve the requisite chemical reactions are often in the order of 700° C. to 1,000° C. III-V compound semiconductors such as gallium arsenide and indium phosphide thermally decompose at such temperatures resulting in one or more components from the decomposed III-V compound being incorporated in the silicon dioxide or silicon nitride coating. The semiconductor properties are altered and the unwanted components of the III-V compound semiconductor may thereafter affect subsequent device processes such as the application of metallized contacts.

The alternate (PECVD) procedure for depositing dielectric mask coatings on III-V compound semiconductors offers the primary advantage of the ability to grow the dielectric mask coatings at relatively low temperatures usually well under 300° C. However, this advantage is offset by the loss in the compositional control of the dielectric material. The coatings may be randomly bonded, highly cross linked in a variable composition. Chemical species other than the desired ones are often included in the dielectric mask coatings. Thus, in (PECVD) films, a range of stoichiometry is possible depending on the plasma and operating conditions; and this variation in the stoichiometry generally results in undersirable variations in electrical, mechanical and chemical properties of the deposited dielectric mask coating leading to poor coating characteristics such as bubbling or cracking.

As a result of these problems, silicon coatings have been used for diffusion masks for III-V compound semiconductors. Silicon coatings, composed of only a single element, are inherently more reproducible. Silicon coatings generally match the thermal coefficients of expansion of the III-V compound semiconductors thereby providing reasonably good performance as a diffusion mask and encapsulation coating. However, difficulties arise when the silicon coatings are subsequently metallized during device processing as a result of the formation of silicides which may be detrimental to device operation.

Therefore, it is a primary object of this invention to provide an improved diffusion mask or encapsulation coating for use with III-V compound semiconductors.

It is a further object of this invention to provide a dual layer mask or encapsulation coating for use with III-V compound semiconductors that maintains the dual advantages of relative impermeability to metallization and the closely matched coefficients of thermal expansion of silicon and III-V compound semiconductors.

Other objects of the invention will be, in part, obvious and will, in part, appear hereinafter. The invention accordingly comprises a mechanism and system possessing the construction, combination of elements and arrangement of parts which are exemplified in the following detailed disclosure.

SUMMARY OF THE INVENTION

A process for providing a mask or encapsulation coating over the exterior surface of a III-V compound semiconductor comprises the first step of depositing a layer of silicon to a select thickness over the exterior surface of the III-V compound semiconductor utilizing a deposition temperature not to exceed the congruent evaporation temperature of the III-V compound semiconductor. A second step comprises depositing a layer of silicon nitride to a select thickness over the exterior surface of the silicon layer. The silicon layer is deposited preferably by electron beam evaporation and the silicon nitride layer is deposited preferably by plasma enhanced chemical vapor deposition. A process for providing a metallized contact to the III-V compound semiconductor having the aforementioned coating comprises first defining a select area to etch on the outside surface of the silicon nitride layer by masking the areas on the outside surface of the silicon nitride layer not to be etched. The silicon nitride layer is thereafter reactive ion etched in the areas selectively defined by masking in the aformentioned step. The silicon layer is thereafter plasma etched in the same areas and titanium and gold are electron beam evaporated in sequence to overlay the etched areas of the III-V compound semiconductor. The titanium and gold are thereafter heat treated to provide an alloy of titanium and gold.

DESCRIPTION OF THE DRAWINGS

The novel features that are considered characteristic of the invention are set forth with particularity in the appended claims. The invention itself, however, both as to its organization and its method of operation, together with other objects and advantages thereof will be best understood from the following description of the illustrated embodiment when read in connection with the accompanying drawings wherein:

DESCRIPTION OF THE PREFERRED EMBODIMENT

Figure 1:
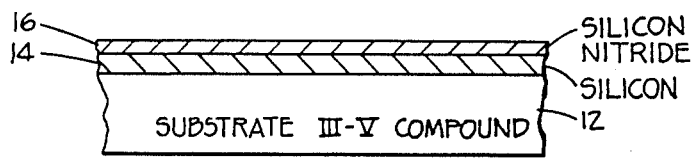
FIG. 1 is a cross-sectional view of a portion of a III-V compound semiconductor having the dual layer coating of this invention.

Referring now to FIG. 1, there is shown a III-V compound semiconductor substrate 12 overlayed in the manner of this invention with dual masking or encapsulation layers 14 and 16. III-V compounds are typically binary, ternary and quaternary compounds composed of elements from the III and V columns of the periodic table including gallium arsenide, indium phosphide, etc. Prior to application of the masking or encapsulation layers 14, 16 in the manner of this invention to be herein described, the III-V compound substrate 12 is degreased or solvent cleaned as follows. Substrate 12 is first soaked for two minutes in trichloroethane, followed by a two minute soaking in acetone, followed by a two minute soaking in methanol. After being soaked, the III-V compound substrate 12 is then blow dried in nitrogen of filter paper. Any oxide that may have formed on the surface of the III-V compound substrate 12 is subsequently removed by soaking the substrate in a one to two mixture of hydrofluoric acid and water for thirty seconds followed by a thirty second rinse with deionized water. The substrate 12 is subsequently blow dried in nitrogen on filter paper.

The first masking or encapsulation layer 14 is applied by E beam evaporating silicon using a Temescal FC-1800 system. The E-beam evaporation is carried out by first loading a high purity carbon crucible with silicon pellets and then evaporating the silicon at a rate of six to eight angstroms per second under a pressure of approximately 1.2 microtorr. The substrate 12 can be heated to a temperature in the range of 150° C. to 300° C. during the evaporation process, and the silicon coating 14 is deposited to a preferred thickness of 1,000 angstroms. The temperature range to which the substrate is heated does not exceed the congruent evaporation temperature of the III-V compound semiconductor. Although the preferred thickness for the silicon layer 14 is 1,000 angstroms, acceptable thicknesses may be in the range of 150 angstroms to 5,000 angstroms.

The next succeeding layer 16 is applied by the plasma enhanced chemical vapor deposition (PECVD) of silicon nitride using a Plasma-Therm Model PK 1432 PD system. The (PECVD) process is accomplished in a chamber pressurized to 650 millitorr. Ammonia gas is directed into the chamber at a flow rate of five standard cubic centimeters per minute, silane gas is directed into the chamber at a flow rate of 390 standard cubic centimeters per minute, and nitrogen gas is directed into the chamber at a flow rate of 700 standard cubic centimeters per minute. The chamber includes an upper electrode which is preferably maintained at a temperature of 60° C. and a lower electrode which is preferably maintained at a temperature of 220° C. under a radio frequency (RF) power of 10 watts. The silicon nitride is preferably deposited to a thickness of 200 angstroms although an acceptable range of thickness is 150 angstroms to 5,000 angstroms. In order to deposit the silicon nitride layer to the preferred 200 angstrom thickness, the plasma enhanced chemical vapor deposition must be maintained for a period of 3.2 minutes.

Figure 2:
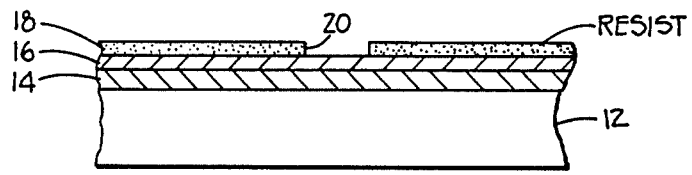
FIG. 2 is a cross-sectional view of the III-V compound substrate of FIG. 1 to which a photoresist has been applied.
Figure 3:
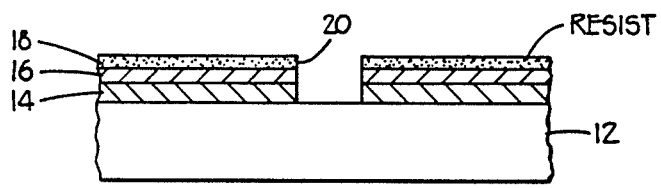
FIG. 3 is a cross-sectional view of a portion of the III-V compound of FIG. 2 which has been selectively etched in the manner of this invention.

A photoresist 18 is applied in a well-known manner as shown in FIG. 2 to define selected openings, one of which is shown at 20. The silicon and silicon nitride layers 14, 16 are thereafter etched in the area immediately adjacent the opening 20 using a Plasma-Therm dual chamber etch system (Model No. 520/540). The silicon nitride layer 16 is etched in a chamber maintained at a pressure of 20 millitorr into which oxygen is directed at a flow rate of 5 standard cubic centimeters per minute, and carbontetrafluoride is directed at a flow rate of 20 standard cubic centimeters per minute. The radio frequency (RF) power is maintained at 50 watts for 45 seconds to reactive ion etch the silicon nitride layer 16 as shown in FIG. 3. In order to thereafter etch the silicon layer 14, the chamber is repressurized to 350 millitorr, and oxygen is directed therein at a flow rate of two standard cubic centimeters per minute, and carbontetrafluoride is directed therein at a flow rate of 40 standard cubic centimeters per minute. The radio frequency (RF) power is maintained at 150 watts for preferably six minutes to plasma etch the silicon layer 14 as shown in FIG. 3.

Figure 4:
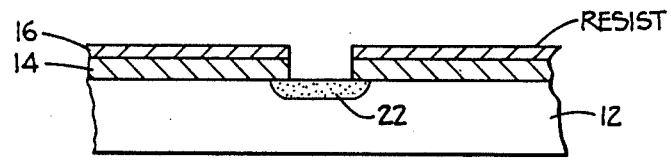
FIG. 4 is a cross-sectional view of a portion of a III-V compound of FIG. 3 to which zinc has been diffused.
Figure 5:
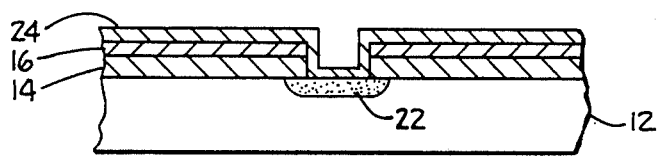
FIG. 5 is a cross-sectional view of a portion of the III-V compound of FIG. 4 to which a metallized coating has been applied.

A zinc diffusion step may thereafter be carried out in a well-known manner in a Pacific Western diffusion furnace using gallium arsenide/zinc arsenide (GaAs/Zn2As3) source material to provide the zinc diffusing region 22 as shown at FIG. 4. The zinc diffusion is preferably conducted at a temperature of 650° C. for three hours although an acceptable range of zinc diffusion temperatures are from 300° C. to 900° C. within a time range of 30 minutes to 100 hours.

Figure 6:
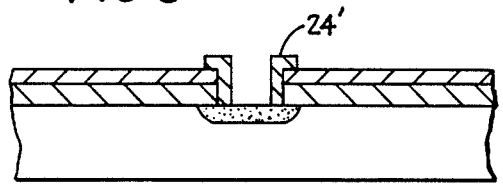
FIG. 6 is a cross-sectional view of a portion of the III-V compound of FIG. 5 in which the metallized coating has been selectively etched to define a specific metallized contact.

A metallized layer as shown at 24 is deposited by the E-beam evaporation of titanium/gold using a Temescal FC-1800 system. The titanium is deposited by evaporating titanium pellets loaded in a high purity carbon crucible at a rate of 5 angstroms per second under a pressure of 1.2 microtorr. The titanium is preferably coated to a thickness of 250 angstroms, although an acceptable range of thicknesses is between 150 angstroms and 1,000 angstroms. The gold is evaporated from gold pellets loaded in a high purity carbon crucible at an evaporation rate of 10 angstroms per second under a pressure of less than 1.2 microtorr. The gold is preferably coated to a thickness of 2.5 kiloangstroms but may have an acceptable range of thicknesses of 1.5 kiloangstroms to 10 kiloangstroms. The gold and titanium layers are thereafter alloyed by heat treatment at 420° C. for one minute in a conventional strip heater alloy station. Acceptable alloy temperatures are in the range of 300° C. to 700° C., while acceptable alloying times are in the range of 15 seconds to 60 minutes. The alloy titanium and gold layer is thereafter selectively removed to provide the contact 24' as shown in FIG. 6 by well-known photoresist and etching techniques.

Thus, in this manner there is provided the dual layer masking or encapsulation coating of this invention comprising the silicon layer 14 which substantially matches the thermal coefficient of expansion of the III-V compound semiconductor substrate and a silicon nitride layer 16 which is substantially impermeable to the absorption of the metallized contact 24'. In addition, the color of the silicon nitride layer 16 substantially contrasts with the color of the III-V compound semiconductor substrate 12 thereby facilitating mask alignment subsequent to etching.

Other embodiments of the invention including additions, subtractions, deletions and other modifications of the preferred disclosed embodiments of the invention will be obvious to those skilled in the art and are within the scope of the following claims.

What is claimed is:

1. A process for providing a mask or encapsulation coating over the exterior surface of a III-V compound semiconductor, said process comprising the steps of:
    depositing a layer of silicon to a select thickness over the exterior surface of the III-V compound semiconductor utilizing a deposition temperature not to exceed the congruent evaporation temperature of the III-V compound semiconductor; and
    depositing a layer of silicon nitride to a select thickness over the exterior surface of the silicon layer.

2. The process of claim 1 wherein said silicon is deposited by electron beam evaporation and said silicon nitride is deposited by plasma enhanced chemical vapor deposition.

3. The process of claim 2 wherein said silicon is deposited to a thickness within the range of 150 angstroms to 5000 angstroms.

4. The process of claim 3 wherein said silicon is electron beam evaporated at a rate of 6 to 8 angstroms per second and said III-V compound semiconductor is heated to a temperature in the range of 150° C. to 300° C. during said electron beam evaporation of said silicon.

5. The process of claim 4 wherein said silicon is electron beam evaporated at a pressure of approximately 1.2 microtorr.

6. The process of claim 2 wherein said silicon nitride is deposited to a thickness within the range of 150 angstroms to 5000 angstroms.

7. The process of claim 6 wherein said silicon nitride is deposited by introducing: ammonia gas at a flow rate of approximately 5 standard cubic centimeters per minute, silane gas at a flow rate of approximately 390 standard cubic centimeters per minute, and nitrogen gas at a flow rate of 700 standard cubic centimeters per minute.

8. The process of claim 7 wherein said silicon nitride is deposited at a pressure of approximately 650 millitorr.

9. The process of claim 6 wherein said silicon nitride is deposited between an upper electrode maintained at a temperature of approximately 60° C. and a lower electrode maintained at a temperature of approximately 220° C. at a radio frequency power of 10 watts.

10. A process for providing a metallized contact to a III-V compound semiconductor of the type having an encapsulation coating thereon consisting of a layer of silicon deposited on the III-V compound semiconductor at a deposition temperature not exceeding the congruent evaporation temperature of the III-V compound semiconductor, said silicon layer, in turn, being overlayed with a layer of silicon nitride, said process comprising:
    defining select areas to etch on the outside surface of the silicon nitride layer by masking those areas on the outside surface of the silicon nitride layer not to be etched;
    reactive ion etching the silicon nitride layer in the areas selectively defined for etching;
    plasma etching the silicon layer in the areas selectively defined for etching;
    electron beam evaporation titanium and gold in sequence to overlay the select areas of the III-V compound exposed by said etching; and
    heating said titanium and gold to provide an alloy of titanium and gold.

11. The process of claim 10 wherein said plasma etching is conducted in an atmosphere of oxygen and carbontetrafluoride maintained at a pressure of approximately 350 millitorr and utilizing a radio frequency power of approximately 150 watts.

12. The process of claim 11 wherein said oxygen is introduced at a flow rate of approximately 2 standard cubic centimeters and said carbontetrafluoride is introduced at a flow rate of approximately 40 standard cubic centimeters during said plasma etching process.

13. The process of claim 10 wherein said reactive ion etching is conducted in an atmosphere of oxygen and carbontetrafluoride maintained at a pressure of approximately 20 millitorr and utilizing a radio frequency power of approximately 50 watts.

14. The process of claim 13 wherein said oxygen is introduced at a flow rate of approximately 5 standard cubic centimeters and said carbontetrafluoride is introduced at a flow rate of approximately 20 standard cubic centimeters during said reactive ion etching process.

15. The process of claim 10 wherein said titanium is evaporated at a rate of approximately 5 angstroms per second under a pressure of approximately 1.2 microtorr to a thickness in the range of 150 angstroms to 1,000 angstroms.

16. The process of claim 10 wherein said gold is evaporated at a rate of approximately 10 angstroms per second under a pressure less than 1.2 microtorr to a thickness in the range of 1.5 K angstroms to 10 K angstroms.

17. The process of claim 10 wherein said heating of said titanium and gold to provide said titanium gold alloy occurs in a temperature range of 300° C. to 700° C. for a time duration in the range of 15 seconds to 60 seconds.

* * * * *